United States Patent [19]

Hethuin

[11] Patent Number: 5,032,840
[45] Date of Patent: Jul. 16, 1991

[54] METHOD OF RECEIVING PULSES OF THE M.L.S. TYPE AND SYSTEM FOR IMPLEMENTING THIS METHOD

[75] Inventor: Serge Hethuin, Saint Remy les Chevreuses, France

[73] Assignee: U.S. Philips Corporation, New York, N.Y.

[21] Appl. No.: 543,597

[22] Filed: Jun. 25, 1990

[30] Foreign Application Priority Data

Jul. 28, 1989 [FR] France .................................. 89 10186

[51] Int. Cl.$^5$ .............................................. G01S 1/02
[52] U.S. Cl. ...................................... 342/35; 342/175
[58] Field of Search .......................... 342/35, 134, 175; 364/517

[56] References Cited

U.S. PATENT DOCUMENTS 3,004,707 10/1961 Wilson ................................. 342/175
3,573,825 4/1971 Westby ................................ 342/175

Primary Examiner—Mark Hellner
Attorney, Agent, or Firm—Robert J. Kraus

[57] ABSTRACT

A method of receiving pulses of the M.L.S. type and a system for implementing this method. The method comprises a dividing stage for dividing the received pulse into zones (Z1, ... Z8). A mean value is determined of the samples within each zone in order to obtain the points PI(1) ... PI(8). The straight line DR at best passing through these points provides the instant (tMAX) which is the "time" of the pulse.

4 Claims, 1 Drawing Sheet

METHOD OF RECEIVING PULSES OF THE M.L.S. TYPE AND SYSTEM FOR IMPLEMENTING THIS METHOD

FIELD OF THE INVENTION

The present invention relates to a method of receiving pulses of the M.L.S. type, more specifically, involving a first sampling stage for determining pulse sample values, in combination with sample receive times.

BACKGROUND OF THE INVENTION

A problem posed with this type of pulse is to find the time at which its maximum value occurs. In effect it is important to determine in a most precise manner the time of this maximum value if one wishes to obtain good performance, for example, with an M.L.S. radio navigation system.

Despite the fact that the invention relates more particularly to this system, it will be obvious that the invention also relates to the applications for which one is confronted with this type of problem.

The solution to this problem essentially meets with two kinds of difficulties. The first difficulty is due to the fact that the transmitted pulses are subject to different reflections and are received distorted. The second difficulty is that they can be affected by the noise. Consequently, the detected maximum value is not exactly that of the transmitted pulse.

In European Patent Specification No. 0 192 876, such a method is described which provides measures to solve this problem. However, these measures remain insufficient for providing an exact time especially when the received pulses are embedded in noise.

SUMMARY OF THE INVENTION

The invention has for its object to provide a method of the type mentioned in the opening paragraph which largely solves the above problem and thus provides precise times for the maximum values of the pulses.

Therefore, this method is characterised in that it comprises the following stages:
a second stage for determining the difference between the absolute maximum value and a minimum value of the received pulse;
a third stage for dividing said difference into zones;
a fourth stage for determining for each zone the number of samples and sample times;
a fifth stage for determining a mean zone time for each zone and a mean zone amplitude;
a sixth stage for producing the receive time of the real maximum value on the basis of mean zone times and mean zone amplitudes;
a seventh stage for rejecting a zone as required.

BRIEF DESCRIPTION OF THE DRAWING

The following description accompanied by the appended drawings, all given by way of a non-limiting example, will enable a better understanding of how the invention may be realised..

DESCRIPTION OF THE PREFERRED EMBODIMENTS

Figure 1:
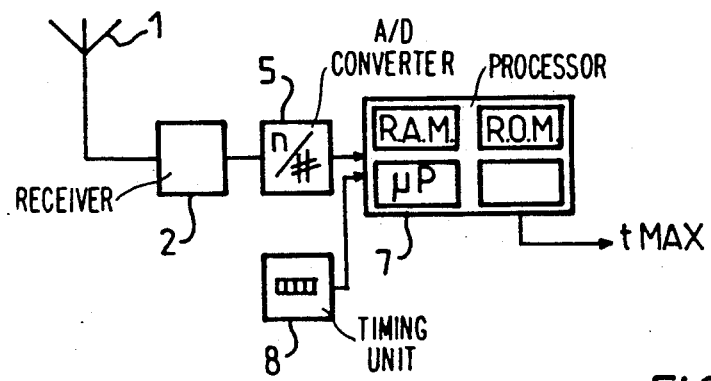
FIG. 1 represents in a diagram a system enabling to implement the invention.

In FIG. 1, reference numeral 1 represents the aerial which receives the pulse on a carrier, the receiver 2 performs the usual operations of amplification, demodulation and other operations so that an analog-to-digital converter 5 can apply samples accompanied by their times, called sample times, to the processor 7. The sample time is formed by means of a timing unit 8. The central processing unit 7 is constituted by a microprocessor around which one finds a random access memory, a read-only memory specifically containing the program information defining the method according to the invention.

Figure 2:
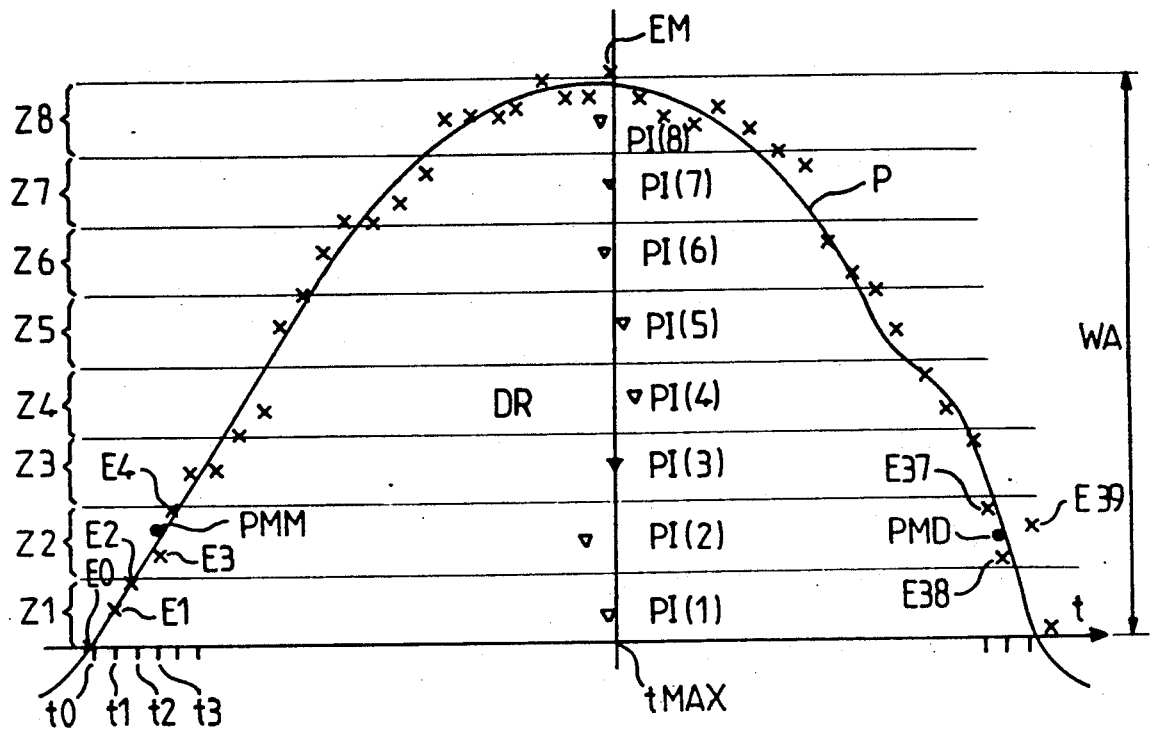
FIG. 2 shows a pulse of the M.L.S. type to which the method according to the invention is applied.

The method according to the invention may be explained with the aid of FIG. 2. In this Figure the crosses represent the different samples E0, E1, E2, E3, . . . of a pulse P of the M.L.S. type represented in a full line. To each of these samples a sample time t0, t1, t2, t3, . . . corresponds.

According to the invention the maximum value for the samples is determined. Let us assume that EM is this sample and AM its amplitude. Also the minimum value of all the samples is determined, that is to say, EO having an amplitude AO, which may be the detection threshold known a priori. In this described example the difference WA between these two values Am and AO is subdivided into eight zones Z1, Z2, . . . , Z8. These zones define amplitude domains DA having a value of: DA=WA/8, where WA=AM−AO.

In each zone a mean amplitude value is determined associated to a mean time value; thus for the zone Z2 one has for the rising edge of pulse P the samples E3 and E4 of the times t3 and t4 and for the falling edge the samples E37, E38 and E39 having the respective times t37, t38, and t39; first the mean value of the amplitudes VMM for the rising edge is calculated:

$$VMM=(E3+E4)/2$$

then the mean value of the times tMM.

$$tMM=(t3+t4)/2$$

In FIG. 2 the point PMM having the coordinates VMM and tMM is plotted. For the falling edge the mean amplitudes value VMD is:

$$VMD=(E37+E38+E39)/3$$

and the mean time value tMD:

$$tMD=(t37+t38+t39)/3$$

These coordinates determine the point PMD.

On the basis of these values the mean points VI(i) and TI(i) for each zone "i" are determined. Thus for the zone Z2:

$$VI(2)=(VMD+VMM)/2$$

$$TI(2)=(tMD+tMM)/2.$$

One thus obtains a plurality of points, PI(i) represented in FIG. 2.

At these points VI(i) and TI(i) relating to N' zones a linear regression is realised. In effect, it is suitable not to consider all the zones and reject those which do not produce any significant information. N' is the remainder of the possible zones after:
the elimination of the zones where information is not available either in the rising edge or in the falling edge,
the elimination of zones that may present considerable disturbance.

In order to realise this linear regression, first the following mean barycentre values VRL and TRl are calculated:

$$VRL = \frac{1}{N} \sum_{i=1}^{N} VI(i) \quad i \neq \text{rejected zones}$$

$$TRL = \frac{1}{N} \sum_{i=1}^{N} TI(i) \quad i \neq \text{rejected zones}$$

For a faster calculation, one only calculates:

$$N \cdot VRL = \sum_{i=1}^{N} VI(i) \quad i \neq \text{rejected zones}$$

and $$e + N \cdot TRL = \sum_{i=1}^{N} TC(i) \quad i \neq \text{rejected zones}$$

Subsequently, the centred values VC(i) and TC(i) are determined:

$$VC(i) = N \cdot VI(i) - N \cdot VRL$$

$$TC(i) = N \cdot TI(i) - N \cdot TRL$$

i: designating the zones that have not been rejected.

Thereafter, the regression straight line DR which at best passes through the points PI(i) is determined. This straight line DR has a slope "p".

$$p = \left( \sum_{i=1}^{N} VC(i) \cdot TC(i) \right) / \left( \sum_{i=1}^{N} VC(i)^2 \right) \quad i \neq \text{rejected zones}$$

from which finally tMAX:

$$tMAX = \frac{1}{N} [p \cdot (N \cdot AM - N \cdot VRL) + N \cdot TRL]$$

I claim:

1. A method of determining the time when a pulse is received, comprising the steps of:
   a. sampling the instantaneous value of the pulse at a plurality of different times;
   b. determining the difference between the maximum value sampled and a predetermined threshold value;
   c. dividing the difference into a plurality of zones;
   d. determining the values and times of the samples in each zone;
   e. determining from the values and times of the samples in each zone a mean value and a mean time; and
   f. determining from the mean values and mean times for the respective zones the time when the pulse was received.

2. A method as in claim 1 where the pulse time is determined by linear regression.

3. A method as in claim 1 or 2 where zones which do not produce significant information are eliminated from the determination of the pulse time.

4. An apparatus for determining the time when a pulse is received, said apparatus comprising a processing unit comprising means for:
   a. sampling the instantaneous value of the pulse at a plurality of different times;
   b. determining the difference between the maximum value sampled and a predetermined threshold value;
   c. dividing the difference into a plurality of zones;
   d. determining the values and times of the samples in each zone;
   e. determining from the values and times of the samples in each zone a mean value and a mean time; and
   f. determining from the mean values and mean times for the respective zones the time when the pulse was received.

* * * * *